United States Patent
Chia et al.

(10) Patent No.: US 8,733,871 B2
(45) Date of Patent: May 27, 2014

(54) ALCU HARD MASK PROCESS

(75) Inventors: Jin Hao Chia, Singapore (SG); Yong Peng Yeo, Singapore (SG); Wei Leong Lim, Singapore (SG); Shi Min Veronica Goh, Singapore (SG); Mei Yu Muk, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 178 days.

(21) Appl. No.: 13/281,417

(22) Filed: Oct. 25, 2011

(65) Prior Publication Data

US 2013/0100185 A1  Apr. 25, 2013

(51) Int. Cl.
*B41J 29/38* (2006.01)
*B41J 2/05* (2006.01)

(52) U.S. Cl.
USPC .................... 347/9; 347/62; 347/63

(58) Field of Classification Search
USPC .................................. 347/9, 62–64
See application file for complete search history.

(56) References Cited

U.S. PATENT DOCUMENTS

| 7,881,594 | B2 | 2/2011 | Fang et al. | |
|---|---|---|---|---|
| 2005/0052501 | A1 | 3/2005 | Nakatani | |
| 2007/0042524 | A1* | 2/2007 | Kogut et al. | 438/52 |
| 2009/0315954 | A1* | 12/2009 | Sakurai et al. | 347/63 |
| 2009/0315955 | A1* | 12/2009 | Sakuma et al. | 347/63 |
| 2010/0163116 | A1 | 7/2010 | Fang et al. | |

* cited by examiner

*Primary Examiner* — Jason Uhlenhake
(74) *Attorney, Agent, or Firm* — Seed IP Law Group PLLC (57) ABSTRACT

A process for forming a metal interconnection in an integrated circuit includes forming a first metal layer and a second metal layer on the first metal layer. Photoresist is placed on the second metal layer and patterned to form a mask. The second metal layer is etched. The mask is then removed and the first metal layer is patterned with the second metal layer acting as mask for the first metal layer.

14 Claims, 9 Drawing Sheets

ALCU HARD MASK PROCESS

BACKGROUND

1. Technical Field

The present disclosure relates to the field of integrated circuits. The present disclosure relates more particularly to integrated circuits in printers.

2. Description of the Related Art

Metal interconnections are a standard feature of integrated circuits. Integrated circuits typically include a monocrystalline semiconductor substrate on which transistors are formed. Source and drain regions of the transistors are formed in the semiconductor substrate and a gate electrode is formed above the semiconductor substrate. A series of metal layers are formed above the semiconductor substrate. Metal tracks are formed in each metal layer. The first metal layer is typically called metal 1 with the next metal layer above that being called metal 2 and so forth. The metal layers are patterned to form metal tracks. Vias are formed in the dielectric materials separating metal layers so that metal tracks from one metal layer can be electrically connected to metal tracks in a lower or higher metal layer. Contact vias are also made to contact the source drain and gate electrodes of the transistors to electrically connect them to the metal tracks.

In a typical metal interconnection, a metal track of a first metal layer is electrically connected to a metal track of a second metal layer. After the first metal track is formed, a dielectric material is deposited on the first metal layer. The dielectric layer is then etched in a selected location to open a via to the first metal layer. The second metal layer is then deposited, patterned, and etched to form metal tracks in the second metal layer. When second metal layer is deposited, the via is filled with the second metal which acts as a contact via to the metal tracks formed by the first metal layer. Typically a thin barrier layer, or an adhesion layer, will be deposited just prior to the deposition of the second metal layer. The barrier layer overlies the dielectric layer and lines the inner walls of the via formed in the dielectric layer. The barrier layer also contacts the exposed portion of the first metal layer. After the barrier layer has been deposited, the second metal layer is then deposited, entirely filling the rest of the via and forming a metal layer on top of the insulating layer. The metal layer and the barrier layer are subsequently patterned and etched to form the desired metal tracks and interconnections.

Figure 1A:
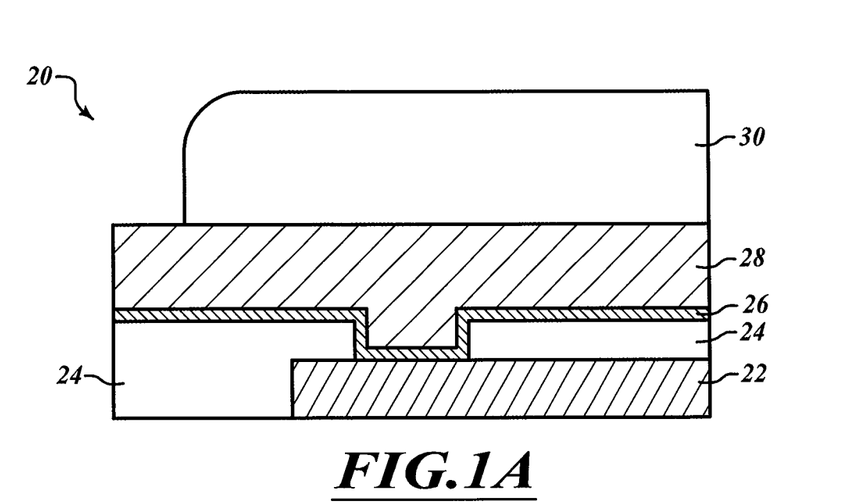
FIGS. 1A-1D illustrate a conventional metal interconnection of an integrated circuit at successive stages of manufacture.

FIG. 1A illustrates a conventional metal interconnection 20. A first metal track 22 is formed of metal 1. The first metal track 22 is, for example, AlCu. A dielectric layer 24 is then formed on the first metal track 22. The dielectric layer 24 may include multiple layers including silicon dioxide, silicon nitride, phosphor-silicate glass, or spin-on glass. The dielectric layer 24 has been etched to expose a portion of the metal track 22. A Ta barrier layer, for example 500 Å thick, has been deposited on the dielectric layer 24 and covers the sidewalls of the dielectric layer 24 as well as the exposed portion of the first metal track 22. A second metal 28 layer is deposited on top of the Ta layer. The metal layer 28 is, for example, gold, and is 3.7 kÅ thick. A photoresist layer 30 has been formed on top of the metal layer 28. The photoresist layer 30 has been patterned to form a mask in the desired pattern of the metal tracks which will be formed of the metal layer 28 and the barrier layer 26.

Figure 1B:
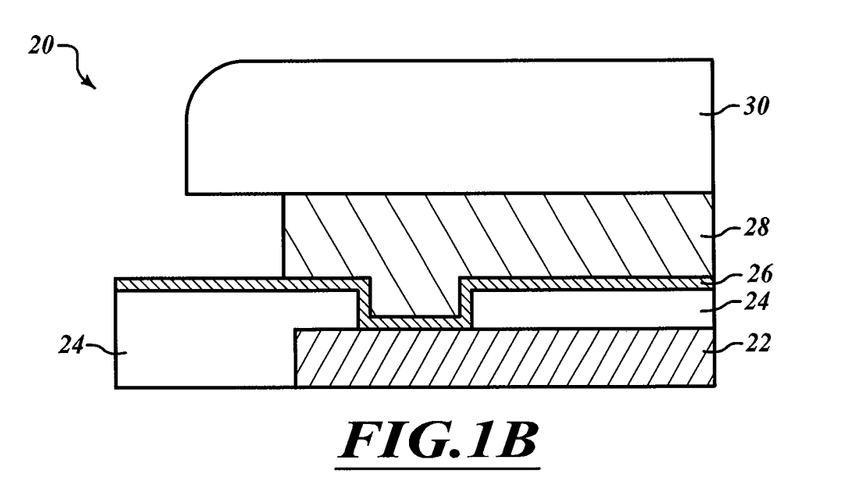

In FIG. 1B, the second metal layer 28 has been subjected to an isotropic wet metal etch. The wet metal etch etches the gold layer 28 outside of the photoresist layer 30. Because an isotopic etch was used, a portion of the gold metal layer 28 was undercut below the photoresist to form an overhang.

Figure 1C:
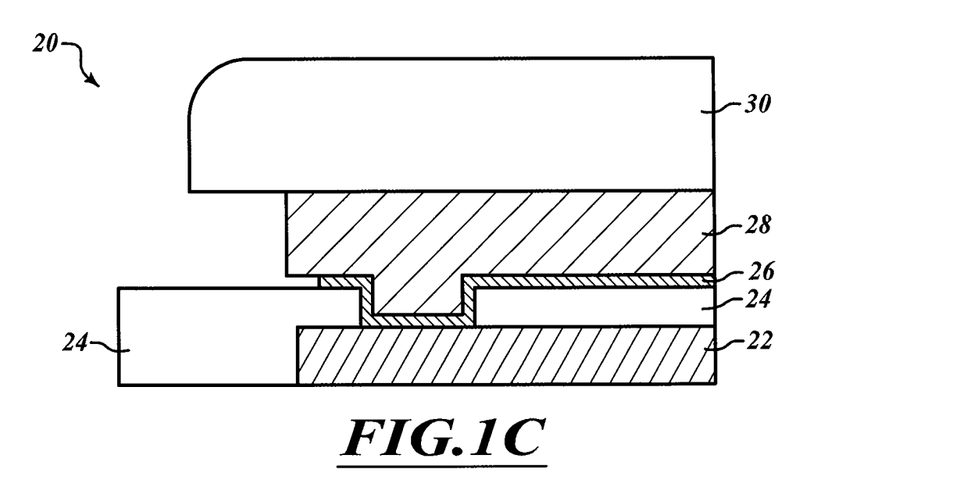
Figure 1D:
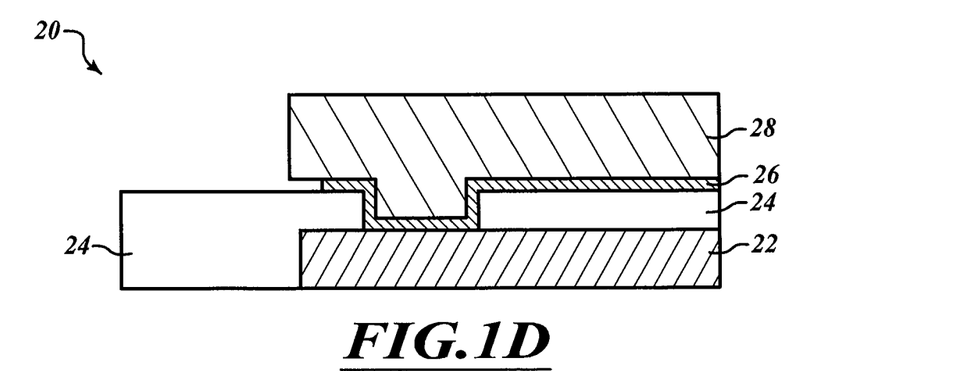

In FIG. 1C the Ta layer 26 is also subjected to an isotropic wet metal etch. The Ta layer 26 is etched outside of the photoresist layer 30 and the gold layer 28. Because an isotopic etch was used, a small portion of the Ta layer 26 is also etched under the edge of the gold layer 28. In FIG. 1D, the photoresist layer 30 has been stripped away. After the photoresist layer 30 is stripped away, a spin dry process is performed to dry the integrated circuit.

As discussed above, the top metal layer 28 is typically made of gold because it does not corrode easily and adds excellent adherence properties to the photoresist layer so that the metal layers can be etched as a single stack with the photoresist present. Gold also has other benefits of being an excellent conductor of both electricity and heat. The gold can rapidly transfer heat away from the heater for the Ta layer 26 and can also provide good electrical coupling.

Unfortunately, gold has recently become extremely expensive, and with the rising gold prices it is desirable to use another metal besides gold for the upper layer 28. Unfortunately, simply substituting another metal layer for gold cannot easily be done and several difficulties are encountered if the current process is used and another metal is merely substituted in place of the gold layer 28.

The use of a Ta alloy, such as tantalum silicon oxide as a resistor in the heater section of an ink jet printer, is well known in the art and is described for example in U.S. Patent Publication 2005/0052501. In addition, the use of gold as a top metal layer as part of a nozzle for an ink jet printer is described in various issued U.S. patents and other patent publications including U.S. Pat. No. 7,881,594 and U.S. Patent Publication 2010/0163116. Any reference to Ta herein therefore includes alloys thereof and structures that can act as resistors.

BRIEF SUMMARY

One embodiment is a metal interconnection structure including a first metal track and a dielectric layer formed on the first metal track. The dielectric layer is patterned to expose a portion of the first metal track. A barrier layer is formed on the dielectric layer and on the exposed portion of the first metal track. A second metal layer is formed on the barrier layer. In one embodiment, the second metal layer is AlCu and the barrier layer is Ta or a Ta alloy, as stated above.

In one embodiment, a photoresist layer is formed and patterned on the second metal layer. The photoresist layer is patterned in the desired shape of metal tracks to be formed of the second metal layer. The second metal layer is subjected to a wet etch to pattern the second metal layer to form a second metal track. The barrier is subsequently subjected to a wet metal etch to pattern the barrier layer in the pattern of the second metal track. In one embodiment, the photoresist layer is stripped before etching the barrier layer. The second metal layer acts as a hard mask for the wet metal etch of the second metal layer.

One embodiment is a method of forming a metal interconnection. The method includes forming a first metal track and a dielectric layer on the first metal track. The method further includes removing a portion of the dielectric layer to expose a portion of the first metal track. A barrier layer is then formed on the dielectric layer and the exposed portion of the first metal track. A second metal layer is then formed on the barrier layer. The second metal layer is then patterned and etched using a photoresist mask. A spin dry procedure is then performed. A wet resist strip is then preformed to remove the photoresist from the second metal layer. A spin dry procedure is then performed again. A wet etch is then performed to etch the barrier layer in the desired pattern. The second metal layer acts as a hard mask for the etching of the barrier layer.

DETAILED DESCRIPTION

Figure 2A:
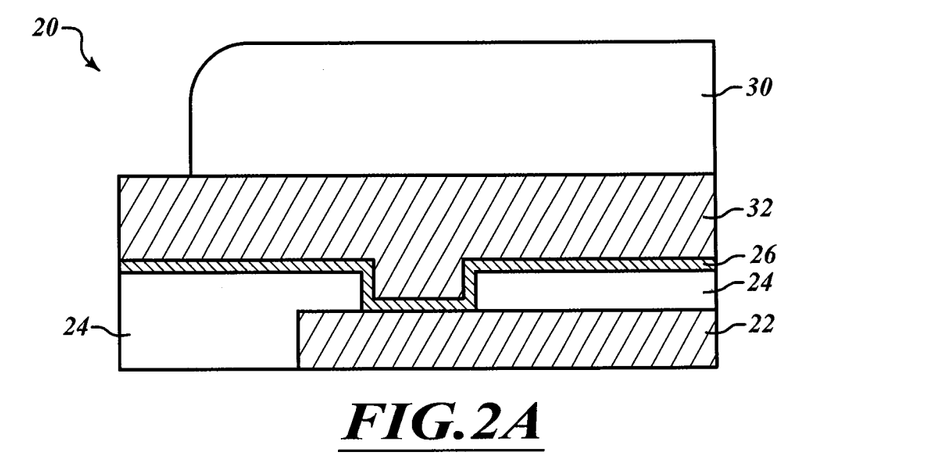
FIGS. 2A-2D illustrate a metal interconnection of an integrated circuit at various successive stages of manufacture.

FIG. 2A illustrates a metal interconnection structure according to one embodiment. The metal interconnection structure 20 includes a first AlCu metal track 22. The first AlCu metal track 22 is covered by a dielectric layer 24. The dielectric layer 24 is, for example, silicon dioxide. The dielectric layer 24 may contain many dielectric layers including silicon dioxide layers, silicon nitride layers, planarizing layers, phosphosilicate glass, spin-on glass, etc. The dielectric layer 24 has been etched to expose a portion of the AlCu metal track 22. The AlCu metal track 22 is, for example, formed in a first metal layer of an integrated circuit. The AlCu layer is preferably about 98% Al, 0.5%-1.5% Cu, and 0.5% to 1% Si. A barrier layer 26 of Ta is then deposited on the dielectric layer 24. The barrier layer 26 is, in one example, 500 Å thick. The barrier layer 26 covers the top surface of the dielectric layer 24 as well as side walls of the dielectric layer 24 above the exposed portion of the metal track 22. The barrier layer 26 also covers the exposed portion of the metal track 22. A second metal layer 32 covers the barrier layer 26. The second metal layer 32 is, for example AlCu and is the second metal level of the integrated circuit. The second metal layer 32 is, for example, 14 kÅ thick. A photoresist layer 30 is on top of the second metal layer 32. The photoresist layer 32 has been patterned to form a mask for forming metal tracks of the second metal layer 32.

Figure 2B:
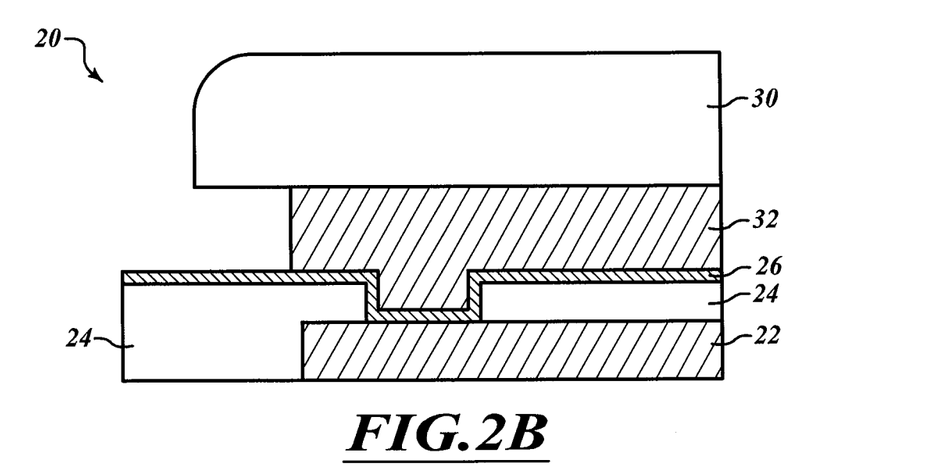

In FIG. 2B, the second metal layer 32 is then exposed to an isotropic wet metal etch. The etch is, for example, a mixture of H3PO4 and HNO3. The wet metal etch etches the AlCu of the second metal layer 32 to form metal tracks in the desired pattern. Because the etch is isotropic, a small portion of the metal track 32 has also been etched underneath the photoresist mask 30 to create an undercut region.

Figure 2C:
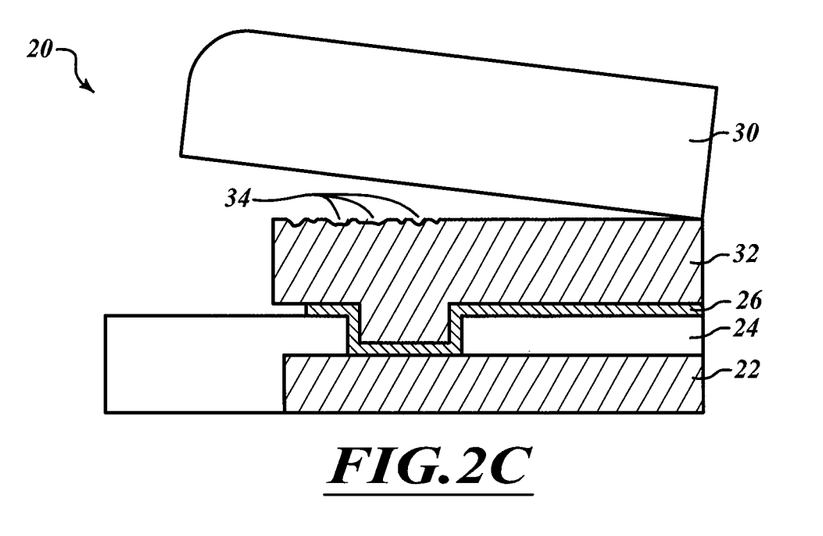

In FIG. 2C, the Ta barrier layer 26 is then subjected to an isotropic wet etch in the presence of the photoresist layer 30. However, because the photoresist layer 30 adheres more poorly to AlCu than to gold, the photoresist layer 30 peels up from the second metal layer 32 when subjected to the etch that is performed of the barrier layer 26. Some of the etchant used to etch the barrier layer 26 get on top of the metal layer 32 and cause pitted areas 34 where the photoresist layer 30 has been peeled away.

The effect of the wet etch carried out on the Ta alloy 26 varies depending on the chemistry of the wet etch material used and the concentration of the etchant. For example, an etchant which is composed of HF and $HNO_3$ mixed in water is capable of etching the Ta layer but does not cause the resist on the AlCu layer to be lifted. Unfortunately, the etch rate is in the rate of 20 Å per minute, and for a Ta layer in the range of 1,500 Å to 2,000 Å the etch must be extended for long periods of time and may cause sever undercutting of both the AlCu layer and the Ta layer even though the resist is not removed. A more aggressive etch which is composed of $CH_3$, COOH at 100% relative concentration with HF and $HNO_3$ in a water-based solution is significantly more effective in etching Ta, usually at a rate of 3,400 Å to 3,500 Å per minute. Unfortunately, this etch chemistry, which is preferred for etching Ta, causes the resist to spontaneously lift from the AlCu layer with the attendant corrosion problems at the edges as previously described.

The etching of the Ta layer with the etch chemistry and the resist in place at the start of the etch causes significant corrosion and pitting of the AlCu layer. In addition, the alloy of AlCu etches much more easily than Au when subjected to the standard etch chemistry of Ta. Au is very corrosion resistant as compared to many metals, such as AlCu. Thus, when AlCu is substituted for Au as the top metal, AlCu is subject to considerably more oxidation, corrosion and etching than the Au layer. It is therefore not a simple matter to substitute AlCu for Au as the second metal layer in the same process flow.

Figure 2D:
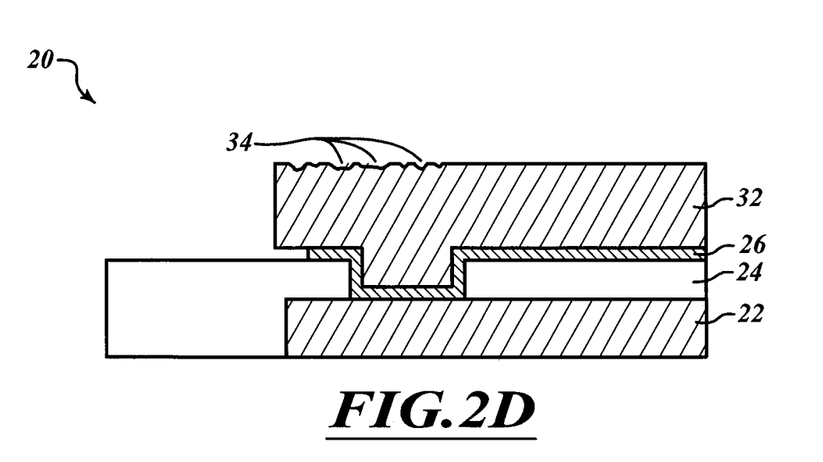

In FIG. 2D, the photoresist layer 30 has been removed. The structure shown in FIG. 2D includes the pitted areas 34 on the second metal track 32. The pitted areas 34 are problematic in subsequent processing steps. The pitted areas 34 can cause poor adhesion with subsequent layers that will be formed on the second metal layer 32. Another disadvantage of the process and structure illustrated in FIGS. 2A-2D is that when the photoresist layer 30 peels off from the second metal layer 32 serious problems can occur in subsequent processing steps. Peeled off portions of the photoresist can stick onto carriers and machine parts in fabrication area. This can cause serious defects in the wafers being formed as well as machine failure. Defects in the wafers can cause the integrated circuits to function very poorly or not at all. The yields of such production runs may therefore drop below 90%, and in some cases, below 70%, which directly impacts the profits of the chip maker. Machine failure in the fabrication area can shut down processing of wafers altogether until problems have been resolved. This can be an enormous financial hardship for the maker of integrated circuits.

Nevertheless choice of AlCu for the second metal layer 32 instead of gold has some advantages. AlCu is much less expensive than gold, yet AlCu has very similar electrical characteristics to gold. Furthermore, some of the risks of using gold in a fabrication process are avoided by using AlCu. Any amount of gold that contaminates the semiconductor substrate of the integrated circuit can cause serious device malfunction. The transistors formed in the semiconductor substrate may be contaminated by stray gold atoms which are highly mobile in the silicon substrate. The mobile gold atoms may contaminate source, drain, and channel regions of transistors formed in the semiconductor substrate and cause serious functional problems of the transistors. When transistors of an integrated circuit fail, the entire integrated circuit may become useless. Thus there are several advantages to using AlCu for the second metal layer 32.

It is therefore desirable to provide structure and process which can use AlCu as the top metal with high yields.

Figure 3A:
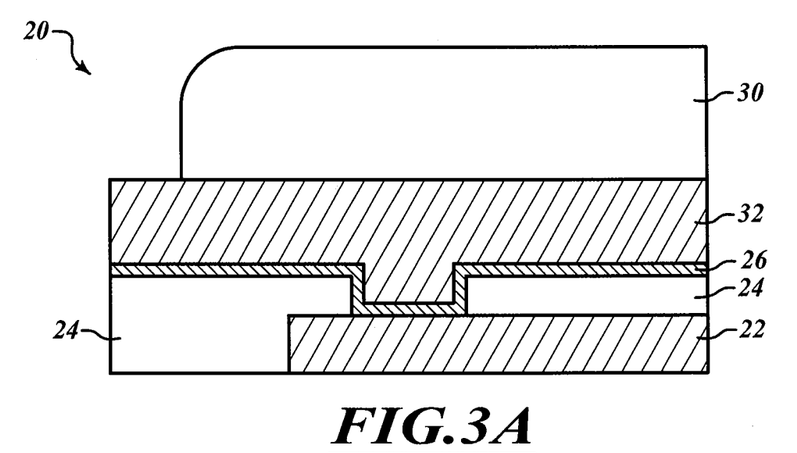
FIGS. 3A-3D illustrate a metal interconnection of an integrated circuit at various stages of manufacture according to a hard mask process according to another preferred embodiment.
Figure 3B:
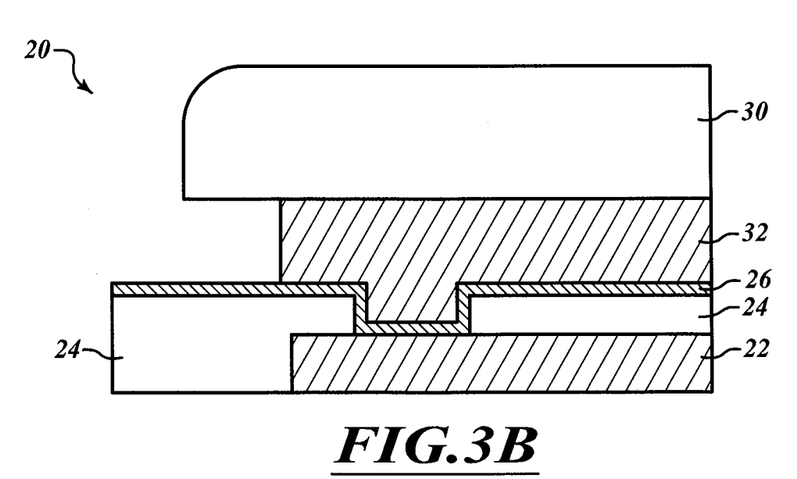

FIG. 3A illustrates a metal interconnection 20 of an integrated circuit according to one embodiment. The layers structure illustrated in FIGS. 3A and 3B are the same layers as the structures illustrated in FIGS. 2A and 2B but with different thicknesses. The AlCu layer 32 is made approximately 10% thicker than the AlCu layer 32 as shown in FIGS. 2A and 2B. As explained later herein, the entire layer 32 will be subject to an unmasked etch while the Ta layer under it are being etched and providing the additional thickness for the layer 32 ensures that even though some of it is etched away, the final thickness will be sufficient to have the desired low resistivity and high thermal conductivity. For example, in FIG. 3A the layer 32 may be in the range of 16,000 Å, namely 1.6 microns in thickness at this stage of the process. In FIG. 3A a photoresist mask 30 is formed on the second metal layer 32. In FIG. 3B the second metal layer has been etched using an isotropic wet etch.

Figure 3C:
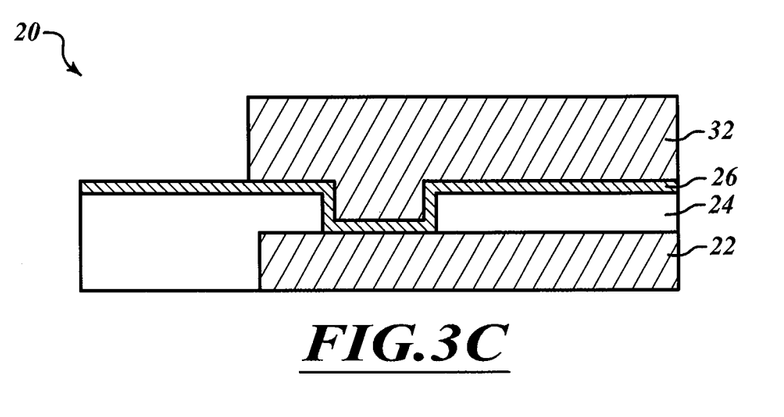

As shown in FIG. 3C, the photoresist layer 30 is then stripped away prior to etching of the barrier layer 26. Rather than using the photoresist layer 30 as a mask for etching the barrier layer 26, the second metal layer 32 is used as a hard mask for determining the etch locations for the barrier 26. The etchant that is selected to etch the Ta barrier layer 26 is a water-based mixture of HF, $HNO_3$, $CH_3$, and COOH. This etchant etches Ta with a selectivity of Ta to AlCu of about 10:1. Because the AlCu layer 32 is so thick, for example over 14 kÅ and preferably about 15 kÅ-16 kÅ, the AlCu layer 32 can be used as a hard mask for etching the Ta barrier layer 26. The second metal layer 32 is exposed to the Ta etch, in the time required, about 40 seconds to remove the entire barrier layer outside of the second metal layer 32, a very small portion of the AlCu layer is uniformly etched.

A number of other steps are carried out in order to reduce the impact on the AlCu layer that results from the wet etch carried out at the Ta layer. In one embodiment, after the photoresist 30 has been stripped the wafer is subjected to a deionized water rinse prior to carrying out the etching of the Ta etch, sometimes called a DI water rinse in the art. This cleans the surface of the AlCu layer and removes all photoresist residue to drastically reduce the corrosion which may occur because of the interaction between the photoresist, the etchant and the AlCu during the following steps. According to another preferred embodiment, in addition to a DI water rinse of the wafers, the wafers are subjected to a spin dry after the rinse and prior to introducing the etchant for the Ta etch. Thus, at the beginning of the Ta etch, the wafers have been fully dried and have no water, etchant or resist residue from the prior DI water rinse. In this embodiment, the amount of AlCu which was etched during the etching of the Ta layer was approximately half the amount that was etched without doing the spin dry step prior to beginning the etch. In addition, in one embodiment $N_2$ is bubbled through the DI water rinse while the rinse is taking place. One of the issues the inventors have recognized that is causing corrosion of the upper AlCu layer is the presence of a thin oxide layer or various residue oxygen molecules which may remain on the upper layer of the AlCu. By using $N_2$ bubbling continuously during the DI water rinse, any dissolved oxygen that may be in the gaseous state in the water of the DI rinse is kept away from the surface of the AlCu. This therefore forms a deoxygenation technique which will further help to inhibit corrosion.

Figure 3D:
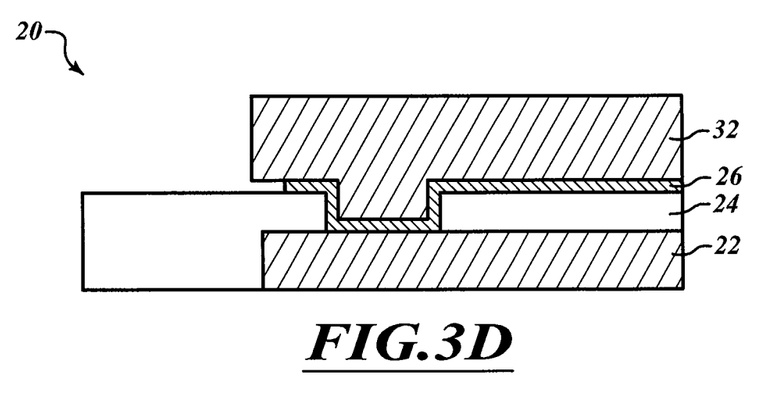

FIG. 3D shows the next step in which the barrier layer 26 is etched of where it is not covered by the AlCu layer 32 while a very small portion of the barrier layer 26 has been etched as undercut below the AlCu layer 32 because it is a wet etch. The AlCu layer 32 itself has not suffered a significant reduction in size. And because the entire AlCu layer 32 has been exposed to the Ta etch, a problem of having different slopes or two tones on the AlCu layer 32 has been avoided. For example, if the top of the AlCu layer 32 is covered in photoresist when the Ta etch is performed, then the uncovered sides and corrosion of the AlCu layer 32 are slightly etched by the Ta etchant while most of the top surface is not etched at all.

As previously stated, the preferred etch chemistry for the etch is a somewhat aggressive etch of the tantalum in which $CH_3$, COOH, HF, and $HNO_3$ are mixed in a solution with water to etch at approximately a rate of 3,500 Å per minute. Accordingly, exposing the tantalum to the etchant for a time period in the range of 30 seconds to 40 seconds is sufficient to ensure that the tantalum is fully etched.

Immediately after the etching of the tantalum, the wafer is subjected to another deionized water rinse. Preferably, the deionized water mix has $N_2$ bubbling continuously therethrough during the post-etch of the Ta wet etch. The use of continuous $N_2$ bubbling through the DI water rinse is a form a deoxygenation which further inhibits corrosion of the AlCu has been found to significantly improve the conductivity of the AlCu and avoid the buildup of a thin oxide layer which can affect surface smoothness and electrical conductivity of the AlCu layer.

The metal interconnection 20 does not suffer from the drawbacks of the metal interconnection layer formed in the process of FIGS. 2A-2D. The photoresist is not peeled away during the Ta etch and, therefore, does not contaminate machinery used in processing the integrated circuits and does not cause defects in the integrated circuit. Furthermore, pitted areas 34 that occurred in the process described for in FIGS. 2C and 2D are not present in the structure of FIG. 3D. Thus, a higher quality structure has been formed without increased costs. Any etching of the AlCu layer during the Ta etch was uniform.

In one embodiment, the metal interconnection structure 20 of FIG. 3D is used as part of a heating circuit in an inkjet printer. The Ta layer 26 can act as a heating layer. When ink in an inkjet printer is to be heated, a current can be passed through the Ta layer 26. The relatively high resistivity of the Ta layer 26 causes a large amount of heat to be generated when the current is passed therethrough. This heat can heat up the ink of an inkjet printer, causing the ink to be expelled in a desired pattern onto paper in a printing process.

While the specific embodiment shown in FIGS. 3A-3D includes AlCu as the metal 2 layer 32, and Ta as the barrier layer 26, many other metals can be used to form a metal interconnection 20 according to principles of the present disclosure. All such metals and combinations of metals fall within the scope of the present disclosure. While the layer 26 has been described as a barrier layer or a heating layer, the layer 26 may also be an adhesion layer, an antireflection layer, or any other suitable layer. Various thicknesses of the layers are also possible. Any suitable etchants other than those described may also be used.

Figure 4:
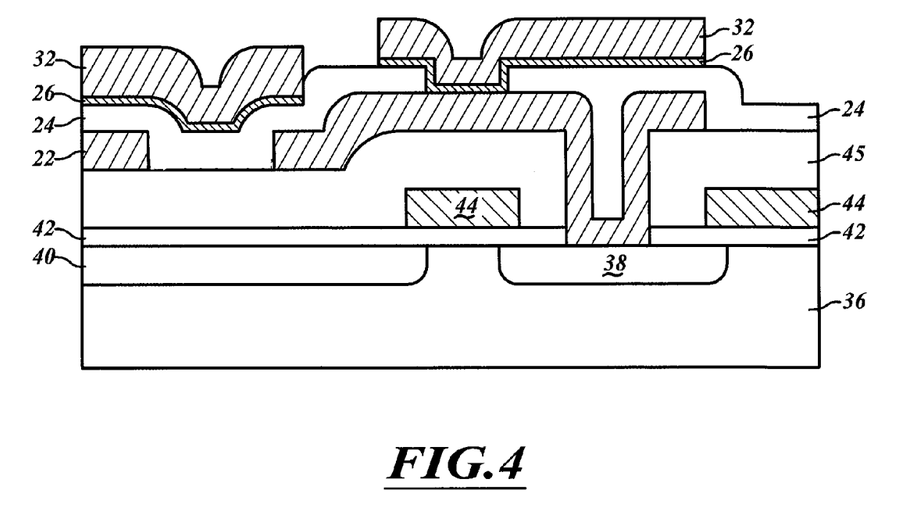
FIG. 4 illustrates an integrated circuit according to one embodiment.

FIG. 4 illustrates a portion of an integrated circuit according to one embodiment. The integrated circuit of FIG. 4 includes a monocrystalline semiconductor layer 36 in which has been formed a source region 38 and a drain region 40. A gate dielectric 42 has been formed on top of the semiconductor layer 36. A gate electrode 44 has been formed on the gate dielectric 42. An insulating layer 45 has been formed on the gate dielectric layer 42 and on the gate electrode 44. The dielectric layer 45 may include multiple dielectric layers including silicon dioxide, silicon nitride, spin-on glass, and other planarizing layers. The dielectric layer 45 has been opened to expose a portion of the source region 38. Metal 1 layer 22, which is formed of AlCu, has been formed on the dielectric layer 45. The first metal layer 22 contacts the source region 38. Dielectric layer 24 has been formed on the first metal layer 22, as described previously. Metal interconnection structure 20 has been formed on the dielectric layer 24 to contact the first metal layer 22. As described in FIG. 3, the second AlCu layer 32 has been used as a hard mask to pattern the barrier layer 26 of Ta. A transistor, which is formed of gate electrode 44, source 30, and drain 40, can be used to control a current passing through the barrier layer 26. The barrier layer 26 can be used as a heating layer to heat the ink in an inkjet printer as described previously.

Figure 5:
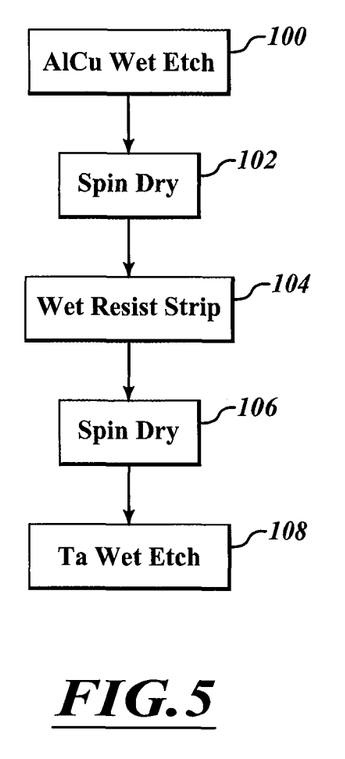
FIG. 5 illustrates a method of producing a metal interconnection according to one embodiment.

FIG. 5 is a flow diagram of a process for forming a metal interconnection 20 according to one embodiment. At 100, an AlCu wet etch has been performed to etch AlCu layer 32, as illustrated in FIGS. 3A-3B. The AlCu wet etch is, for example, as mixture H3PO4 and HNO3. The AlCu wet etch is performed in the presence of photoresist layer 30 as described previously.

At 102, a first deionized water rinse and spin dry process is performed. In the rinse and spin dry process, the wafer on which the integrated circuit is being processed is spun at a very high rate of revolution after the DI water rinse. This causes any remaining material, such as the wet etchant, photoresist residue, etc., to be removed from the wafer by centrifugal force.

At 104, the photoresist layer 30 is stripped away using a wet resist strip process. The wet resist strip process may include using acetone and EKC. Any other suitable etchants may be used. At 106, a second DI rinse and spin dry process is again performed. The spin dry process again removes any remaining liquids and materials from the wet resist strip. As previously described, during the DI water rinse and spin step steps of 102 and 106, $N_2$ as a gas is continuously bubbled through the DI water rinse as a form of deoxygenation which will further inhibit corrosion of the AlCu layer.

At 108, a Ta wet etch is performed to etch the Ta layer 26 as described in relation to FIGS. 3C and 3D. The Ta wet etch includes etching with a mixture of HF, $HNO_3$, $CH_3$, and COOH. Any other suitable etchants may be used. The AlCu layer 32 acts as a hard mask for etching Ta layer 26. Because the AlCu layer 32 is very thick compared to the Ta layer 26, and because the Ta etches Ta with a selectivity of 10:1 relative to AlCu, the AlCu layer 32 is not significantly reduced in size and the Ta layer 26 is etched in the pattern of the AlCu layer 32. While particular chemicals have been described for the etchants may be used that are suitable. Furthermore, other metals may be used in place of AlCu and Ta. Any suitable metals can be used in which one metal may be used as a hard mask for another.

Figure 6:
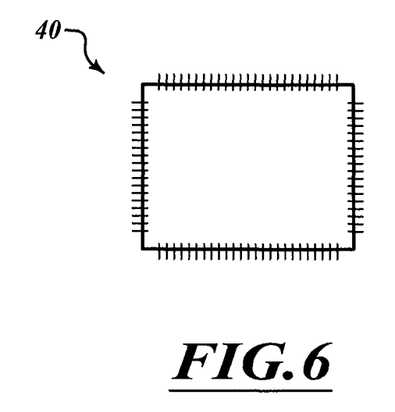
FIG. 6 illustrates an integrated circuit package according to one embodiment.

FIG. 6 illustrates an integrated circuit package 40 according to one embodiment. The integrated circuit package 40 includes an integrated circuit in which has been formed metal interconnection structures 20 according to FIGS. 2-5. In one embodiment, the integrated circuit package 40 is a MEMS device to be used in an inkjet printer. The Ta layer 26, as described previously, can be used as a heating layer to heat up ink for the inkjet printer. While the integrated circuit package 40 is shown in FIG. 6 as a lead frame with protruding leads, any other suitable package configuration can be used. For example, the integrated circuit package 40 can be a ball grid array, a pin grid array, an embedded wafer level ball grid array, or any other suitable package structure.

Figure 7:
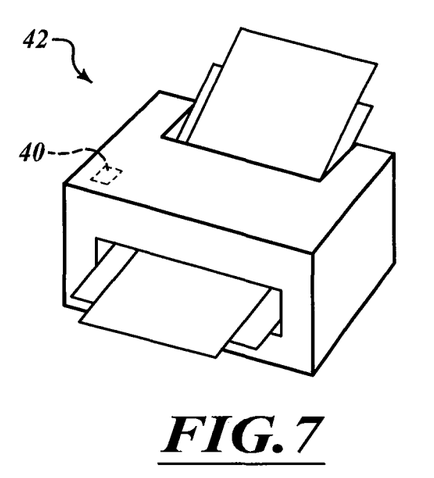
FIG. 7 illustrates a printer according to one embodiment.

FIG. 7 illustrates a printing device 42 according to one embodiment. Printing device 42 includes an integrated circuit package 40, as described in FIG. 6. The integrated circuit package 40 includes metal interconnection structures 20 as described previously. The integrated circuit package 40 can be used to control printing functions in the printing device 42. In one embodiment, the printing device 42 is an inkjet printer. The integrated circuit package 40 may be used to heat up ink to expel the ink onto a paper in a desired pattern. In one embodiment the printing device 42 of FIG. 7 includes an ink cartridge. The ink cartridge contains ink which is passed in proximity to the integrated circuit 40. The Ta layer 26 of the integrated circuit 40 then heats the ink and expels the ink from the printer 42 onto paper in one example.

While particular structures, metals, materials, and etchants have been described in the foregoing disclosure, many other particular metals, etchants, structures, and devices can be used in accordance with principles of the present disclosure while falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Patent Publication 2005/0052501; U.S. Pat. No. 7,881,594; and U.S. Patent Publication 2010/0163116, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
    forming a first metal layer;
    forming a dielectric layer on the first metal layer;
    etching a portion of the dielectric layer to expose a portion of the first metal layer;
    depositing a second metal layer on the dielectric layer and the exposed portion of the first metal layer;
    depositing a third metal layer on the second metal layer;
    forming a photoresist mask on the third metal layer;
    etching the third metal layer in a first wet etch by exposing the third metal layer to an etchant in the presence of the photoresist mask;
    removing the photoresist mask; and
    etching the second metal layer by exposing the second metal layer to a second wet and using the third metal layer as a hard mask for the second metal layer.

2. The method of claim 1 wherein the third metal layer is AlCu.

3. The method of claim 2 wherein the second metal layer is Ta.

4. The method of claim 3 comprising performing a first spin dry process after etching the third metal layer.

5. The method of claim 4 comprising performing a second spin dry process after removing the photoresist mask.

6. A device comprising:
    a semiconductor substrate;
    a first metal track on the semiconductor substrate;
    a dielectric layer formed on the first metal track;
    a Ta based alloy heating element formed on the dielectric layer and an exposed portion of the first metal track; and a second metal track of AlCu overlying and in contact with the Ta heating element, the Ta heating element being self-aligned to the AlCu layer.

7. The device of claim 6 comprising a transistor in the semiconductor substrate.

8. The device of claim 7 wherein the transistor is electrically connected to the first metal track.

9. The device of claim 8 wherein the transistor is configured to allow a current to flow in the heating element.

10. The device of claim 9 wherein the heating element is configured to heat ink to expel the ink onto paper in a printing process.

11. A printer comprising an integrated circuit, the integrated circuit including:
   a semiconductor substrate;
   a first metal track on the semiconductor substrate;
   a dielectric layer formed on the first metal track;
   a Ta heating element on the dielectric layer and an exposed portion of the first metal track;
   an AlCu second metal track on the Ta heating element, the heating element being patterned after the second metal track; and
   a first transistor configured to control a current in the heating element.

12. The printer of claim 11 wherein the integrated circuit controls ejection of ink from the printer.

13. The printer of claim 12 wherein the heating element heats ink of the printer to expel ink from the printer.

14. The printer of claim 13 wherein the second metal track is a hard mask for etching the Ta heating element.

* * * * *